United States Patent
Lin

(10) Patent No.: US 11,566,950 B2
(45) Date of Patent: Jan. 31, 2023

(54) PROCESS AND TEMPERATURE TRACKING REFERENCE LOAD AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 281 days.

(21) Appl. No.: 16/840,497

(22) Filed: Apr. 6, 2020

(65) Prior Publication Data
US 2021/0310882 A1    Oct. 7, 2021

(51) Int. Cl.
| | | |
|---|---|---|
| *G01K 7/16* | (2006.01) | |
| *G01R 19/00* | (2006.01) | |
| *G01R 27/00* | (2006.01) | |
| *G01K 15/00* | (2006.01) | |
| *G01R 19/32* | (2006.01) | |

(52) U.S. Cl.
CPC ........... *G01K 15/005* (2013.01); *G01K 7/16* (2013.01); *G01R 19/0038* (2013.01); *G01R 19/32* (2013.01); *G01R 27/00* (2013.01)

(58) Field of Classification Search
CPC ........ G01K 15/005; G01K 7/16; G01R 19/32; G01R 19/0038; G01R 27/00
See application file for complete search history.

(56) References Cited

U.S. PATENT DOCUMENTS

| | | |
|---|---|---|
| 8,786,271 B2 | 7/2014 | Chang et al. |
| 9,046,909 B2 | 6/2015 | Leibowitz et al. |
| 9,857,824 B1 | 1/2018 | Lin |
| 10,222,818 B1 | 3/2019 | Lin |
| 10,520,972 B2 | 12/2019 | Horng et al. |
| 10,677,664 B1 * | 6/2020 | Wong ................... G01K 15/005 |
| 2009/0201067 A1 | 8/2009 | Haneda |
| 2020/0173862 A1 * | 6/2020 | Coimbra ............... G01K 3/005 |

FOREIGN PATENT DOCUMENTS

| | | | |
|---|---|---|---|
| JP | 2016046617 | * | 4/2016 |
| TW | 200736878 A | | 10/2007 |
| TW | 201214080 A | | 4/2012 |
| TW | 201804278 A | | 2/2018 |
| TW | 201809948 A | | 3/2018 |
| TW | 201931046 A | | 8/2019 |

OTHER PUBLICATIONS

TW Office Action dated Mar. 30, 2021 in Taiwan application (No. 109134241).
Search Report issued in TW Office Action dated Mar. 30, 2021 in Taiwan application (No. 109134241).
English translation of Search Report issued in TW Office Action dated Mar. 30, 2021 in Taiwan application (No. 109134241).

* cited by examiner

*Primary Examiner* — Feba Pothen
(74) *Attorney, Agent, or Firm* — McClure, Qualey & Rodack, LLP

(57) ABSTRACT

A reference load includes a parallel connection of a resistor load having a resistor and a transistor load having a plurality of transistors, wherein a temperature coefficient of the resistor load is positive, and a temperature coefficient of the transistor load is negative.

4 Claims, 5 Drawing Sheets

PROCESS AND TEMPERATURE TRACKING REFERENCE LOAD AND METHOD THEREOF

BACKGROUND OF THE DISCLOSURE

Field of the Disclosure

The present disclosure generally relates to reference load and more particularly to a circuit and method to condition a temperature coefficient of a reference load.

Description of Related Art

Persons of ordinary skill in the art will understand terms used in this disclosure, such as CMOS (complementary metal oxide semiconductor), NMOS (n-channel metal-oxide semiconductor) transistor, PMOS (p-channel metal-oxide semiconductor) transistor, and basic concepts for electronic circuits, such as: "voltage," "current," "load," "inverter," "resistor," "resistance," "switch," "logical signal," "current mirror," and "comparator." Persons of ordinary skill in the art can recognize a resistor symbol, a ground symbol, a PMOS transistor symbol, and NMOS transistor, and can identify the "source," the "gate," and the "drain" of a PMOS transistor or a NMOS transistor. Persons of ordinary skills in the art can read schematics of a circuit comprising resistors, NMOS transistors, and PMOS transistors, and do not need a verbose description about how one transistor connects with another in the schematics. Persons of ordinary skills in the art also understand units such as "° C." (degree Celsius), "micron (μm)," "nanometer (nm)," and "KOhm (Kilo-Ohm)." Terms and basic concepts like these are apparent from prior art documents, e.g. textbooks such as "Design of Analog CMOS Integrated Circuits" by Behzad Razavi, McGraw-Hill (ISBN 0-07-118839-8), which reflect the understanding of persons skilled in the art, and thus will not be explained in detail here.

A speed of a circuit (for instance, an inverter) fabricated using a CMOS (complementary metal oxide semiconductor) process technology is usually highly dependent on PVT (manufacturing Process, supply Voltage, junction Temperature). The supply voltage is relatively easier to control, compared to (manufacturing) process and (junction) temperature. Therefore, circuit designers often choose to adjust the supply voltage of the circuit to maintain a desired speed for the circuit. To establish a steady supply voltage, a voltage regulator is often used, wherein the supply voltage is controlled in a closed-loop manner to track a reference voltage. In this case, circuit designers may choose to adjust the reference voltage in accordance with the process and the temperature, so that the supply voltage can be adjusted for the circuit to maintain a desired speed despite a variation of the process and the temperature.

A reference voltage is usually established using a reference load, wherein a reference current $I_{REF}$ is received and converted into a reference voltage $V_{REF}$. As depicted in FIG. 1A, a prior art reference load 110 comprises a NMOS transistor 111 and a PMOS transistor 112 that are stacked and configured in a diode-connect topology. A "diode-connect" topology is well known in the prior art and thus is not described in detail here. By way of example, a 28 nm CMOS process is used, the W/L (width/length) of NMOS transistor 111 is 1.6 μm/240 nm, the W/L of PMOS transistor 112 is 1.6·m/240 nm, a nominal value of $I_{REF}$ is 7.2 μA, and a nominal value of $V_{REF}$ is 850 mV at 42.5° C.

As depicted in FIG. 1B, an alternative reference load 120, which is disclosed in U.S. Pat. No. 10,222,818, comprises two NMOS transistors 121 and 122 and two PMOS transistors 123 and 124. By way of example, the W/L (width/length) of NMOS transistor 121 is 1.6 μm/240 nm, the W/L (width/length) of NMOS transistor 122 is 1.2 μm/240 nm, the W/L of PMOS transistor 123 is 1.2 μm/240 nm, the W/L of PMOS transistor 124 is 1.6 μm/240 nm, a nominal value of $I_{REF}$ is 13.6 μA, and a nominal value of $V_{REF}$ is 850 mV at 42.5° C. For both reference load 110 and reference load 120, a relation between $I_{REF}$ and $V_{REF}$ is highly temperature dependent. As demonstrated by a curve of a value of $V_{REF}$ versus temperature shown in FIG. 1C, for reference load 110 with $I_{REF}$ being fixed at 7.2 μA, $V_{REF}$ is 850 mV at 42.5° C. (M22), but rises to 946 mV when the temperature drops to −40° C. (M24), and falls to 762 mV when the temperature rises to 125° C. (M23).

As demonstrated by a curve of a value of $V_{REF}$ versus temperature shown in FIG. 1D, for reference load 120 with $I_{REF}$ being fixed at 13.6 μA, $V_{REF}$ is 850 mV at 42.5° C. (M19), but rises to 941 mV when the temperature drops to −40° C. (M20), and falls to 770 mV when the temperature rises to 125° C. (M21). When a temperature rises (falls), a circuit usually becomes slower (faster) and needs the reference voltage to be higher (lower) to maintain the same speed. This need can be served by using a reference current that is a "constant-gm" current or a "PTAT (proportional to absolute temperature) current," wherein the reference current increases monotonically as the temperature rises. On the other hand, given a fixed value of the reference current $I_{REF}$, both reference loads 110 and 120 have a negative temperature coefficient, wherein $V_{REF}$ falls when the temperature rises. Although using either the "constant-gm" current or the "PTAT current" can still make the reference voltage higher when the temperature rises, the negative temperature coefficient somewhat undermines the increase of current.

Accordingly, what is desired is a method to condition a temperature coefficient of a reference load.

BRIEF DESCRIPTION OF THIS DISCLOSURE

In an embodiment, a reference load comprises a parallel connection of a resistor load comprising a resistor and a transistor load comprising a plurality of transistors, wherein a temperature coefficient of the resistor load is positive, and a temperature coefficient of the transistor load is negative. In an embodiment, a resistance of the resistor load is calibrated in accordance with a comparison with a resistance of the transistor load.

In an embodiment, a calibration circuit comprises: a resistor load comprising a tunable resistor controlled by a control signal and configured to receive a first current and establish a first voltage accordingly; an transistor load comprising a plurality of transistors and configured to receive a second current and establish a second voltage accordingly; a comparator configured to output a logical signal in accordance with a comparison of the first voltage with the second voltage; and a finite state machine configured to receive the logical signal and output the control signal.

In an embodiment, a method is disclosed, the method comprises establishing a load of conditioned temperature coefficient by using a parallel connection of a resistor load comprising a resistor and an transistor load comprising a plurality of transistors, wherein a temperature coefficient of the resistor load is positive, and a temperature coefficient of the transistor load is negative. In an embodiment, a resistance of the resistor load is calibrated in accordance with a comparison with a resistance of the transistor load.

DETAILED DESCRIPTION OF THIS DISCLOSURE

The present disclosure is directed to reference load. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

This present disclosure is disclosed from an engineering perspective. For instance, "X is equal to Y" means "a difference between X and Y is smaller than a specified engineering tolerance"; "X is much smaller than Y" means "X divided by Y is smaller than an engineering tolerance"; and "X is zero" means "X is smaller than a specified engineering tolerance."

A logical signal is a voltage that can be either in a high state or in a low state. A switch is a device controlled by a logical signal, wherein the switch is approximately a short circuit when the logical signal is in a high state and approximately an open circuit when the logical signal is in a low state. When we say, "the logical signal X is high (low)," we mean "the logical signal X is in a high (low) state."

Figure 1A:
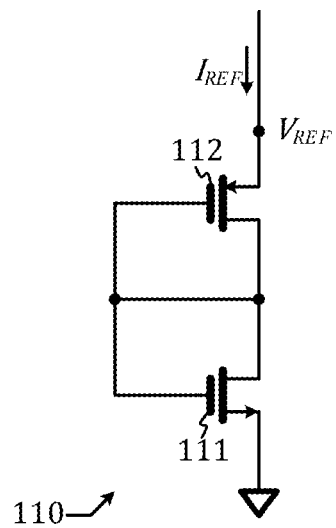
FIG. 1A shows a schematic diagram of a prior art reference load.
Figure 1B:
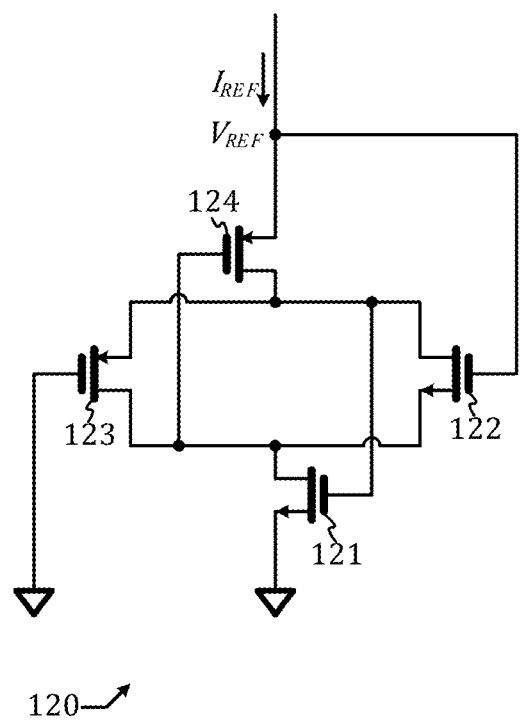
FIG. 1B shows a schematic diagram of another prior art reference load.
Figure 1C:
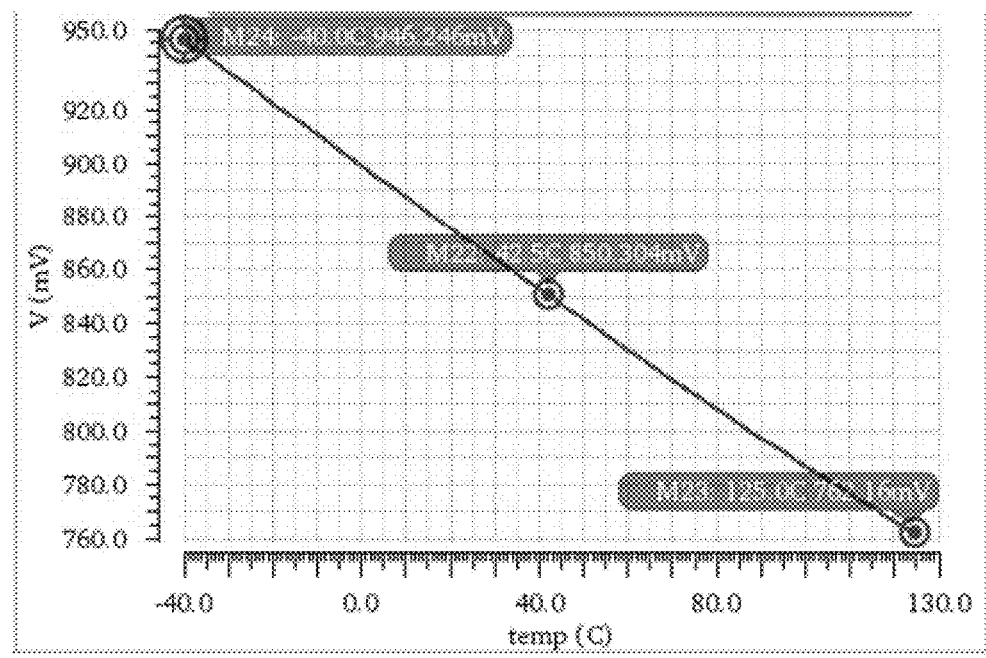
FIG. 1C shows a voltage versus temperature curve of the prior art reference load of FIG. 1A.
Figure 1D:
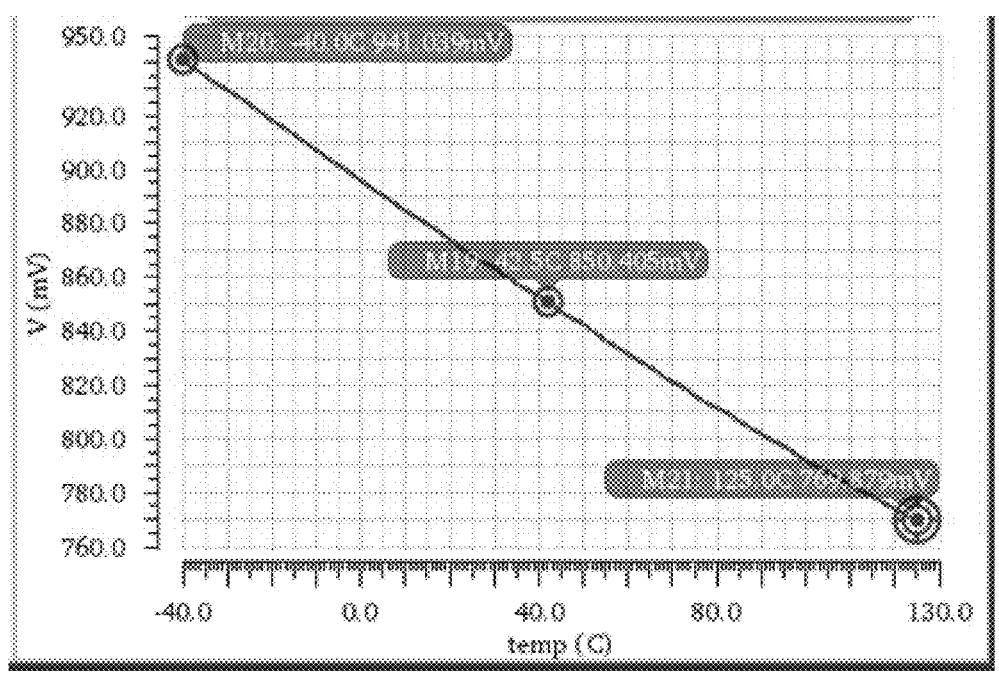
FIG. 1D shows a voltage versus temperature curve of the prior art reference load of FIG. 1B.
Figure 2:
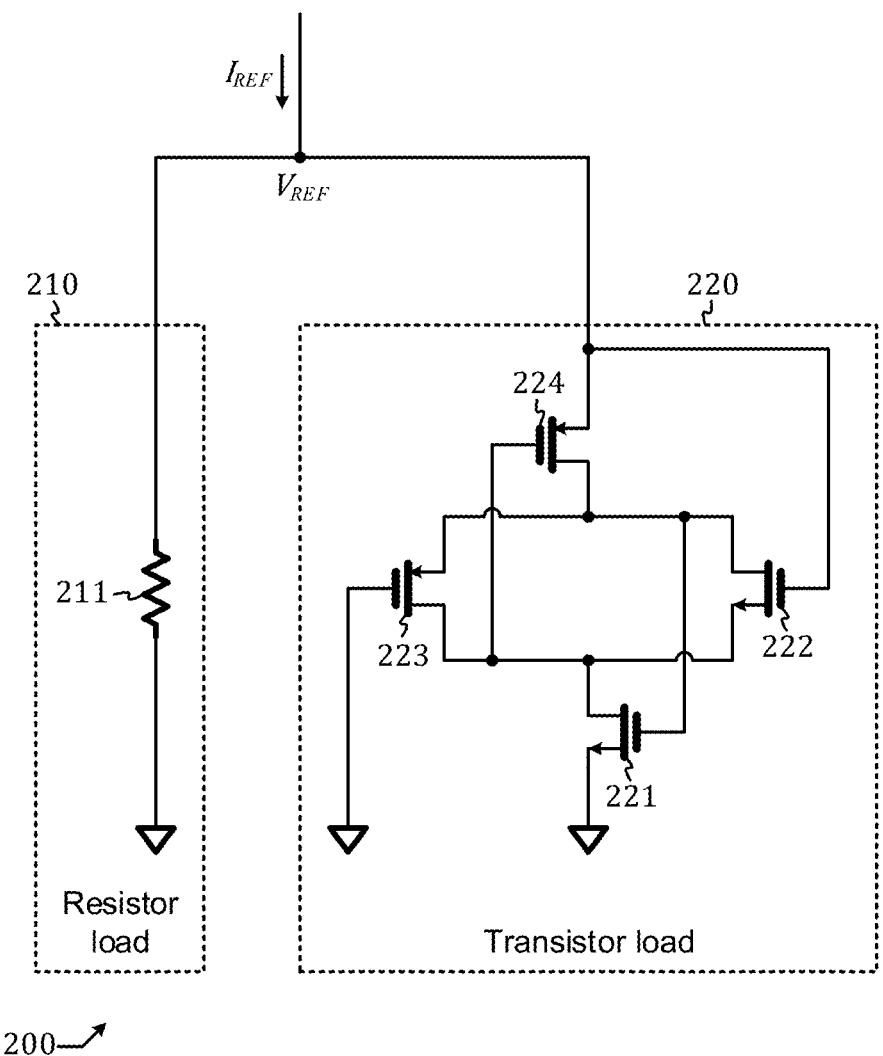
FIG. 2 shows a schematic diagram of a reference load in accordance with an embodiment of the present disclosure.
Figure 3A:
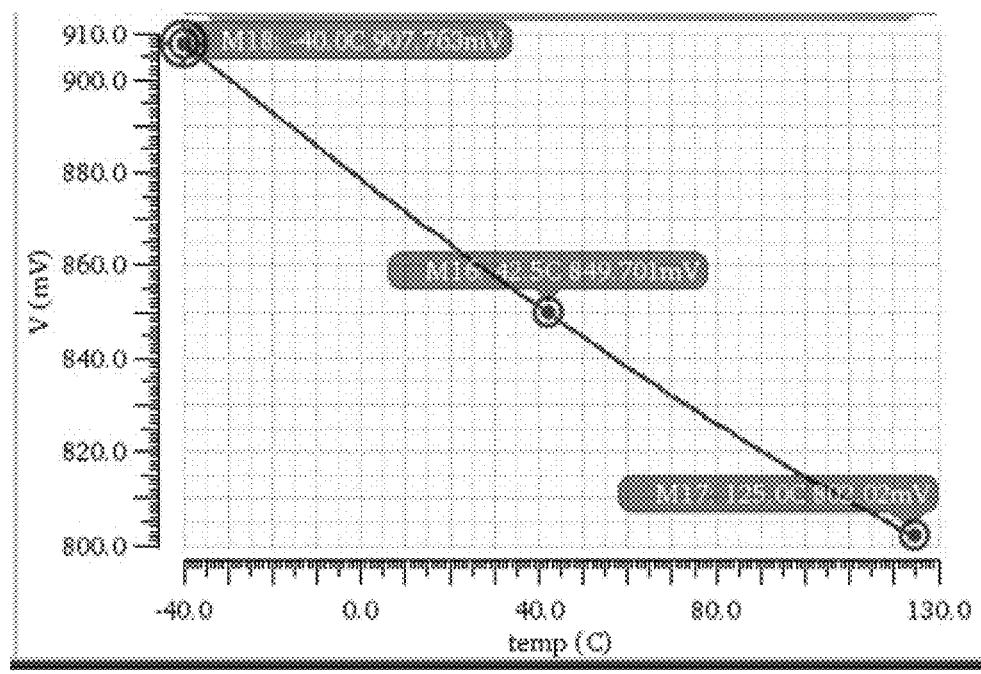
FIG. 3A shows a voltage versus temperature curve of the reference load of FIG. 2.

A schematic diagram of a reference load 200 in accordance with an embodiment of the present disclosure is shown in FIG. 2. Reference load 200 comprises a parallel connection of a resistor load 210 and a transistor load 220. The resistor load 210 comprises a resistor 211. The transistor load 220 comprises two NMOS transistors 221 and 222, and two PMOS transistors 223 and 224. The transistor load 220 is the same as the reference load 120 (in FIG. 1B) and has been described in detail in U.S. Pat. No. 10,222,818 (incorporated herein by reference) and thus not described further herein. By way of example but not limitation: the reference load 200 is fabricated using a 28 nm CMOS process; resistor 211 is 26.6 KOhm; the W/L (width/length) of NMOS transistor 221 is 1.6 µm/240 nm; the W/L of NMOS transistor 222 is 1.2 µm/240 nm; the W/L of PMOS transistor 223 is 1.2 µm/240 nm; the W/L of PMOS transistor 224 is 1.6 m/240 nm; a nominal value of $I_{REF}$ is 44.5 µA; and a nominal value of $V_{REF}$ is 850 mV at 42.5° C. With $I_{REF}$ being fixed at 44.5 µA, a curve of a value of $V_{REF}$ versus temperature is shown in FIG. 3A.

Figure 3B:
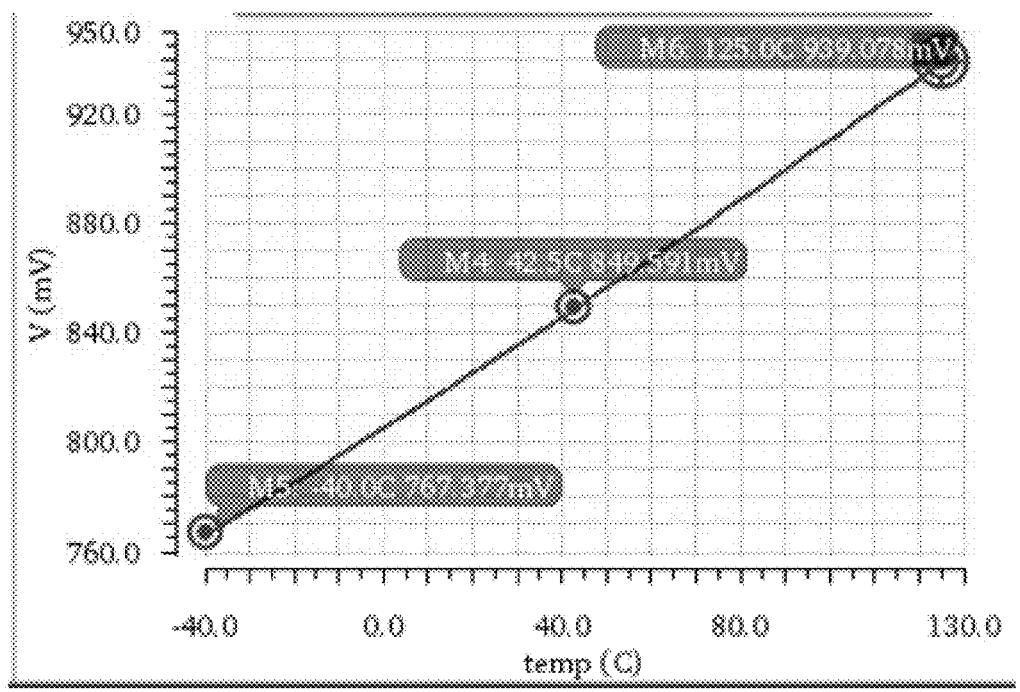
FIG. 3B shows a voltage versus temperature curve of the resistor load in the reference load of FIG. 2.

As shown, $V_{REF}$ is 850 mV at 42.5° C. (M16) but rises to 908 mV when the temperature drops to −40° C. (M18) and falls to 802 mV when the temperature rises to 125° C. (M17). Although it still has a negative temperature coefficient, the voltage varies much less with temperature than in the cases of reference load 110 and reference load 120. A temperature coefficient of the resistor load 210 can be characterized by removing the transistor load 220 and adjusting the reference current $I_{REF}$ so that $V_{REF}$ is still 850 mV at 42.5° C., and then varying the temperature to see how $V_{REF}$ varies accordingly. With the transistor load 220 being removed and $I_{REF}$ being fixed at 31.0 µA, a curve of a value of $V_{REF}$ versus temperature is shown in FIG. 3B.

As shown, $V_{REF}$ is 850 mV at 42.5° C. (M4) but falls to 767 mV when the temperature drops to −40° C. (M5) and rises to 939 mV when the temperature rises to 125° C. (M6). Therefore, the resistor load 210 has a positive temperature coefficient. On the other hand, the transistor load 220, which is the same as reference load 120, has a negative temperature coefficient. The resistor load 210, therefore, compensates the transistor load 220, as far as temperature dependency is concerned. A temperature coefficient of the reference load 200 can be adjusted by adjusting a resistance of the resistor load 210. A smaller (larger) resistance of the resistor load 210 leads to a more (less) pronounced impact from the resistor load 210 and tilts the temperature coefficient of the reference load 200 towards the positive direction.

Figure 4:
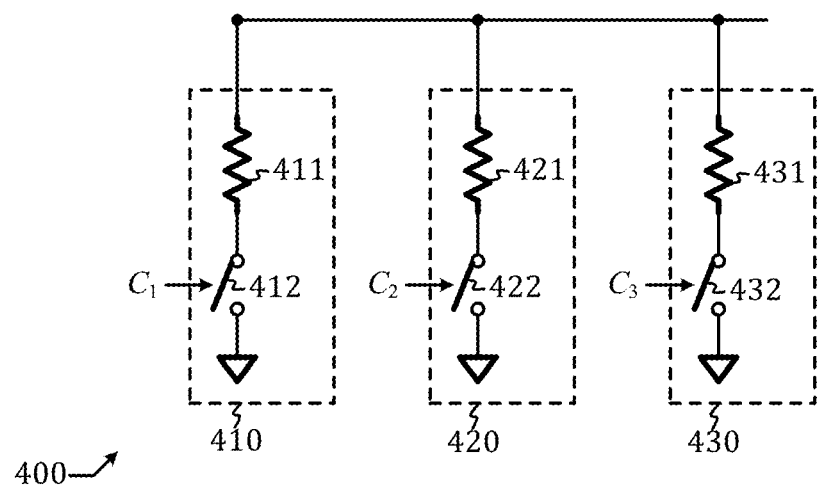
FIG. 4 shows a schematic diagram of a tunable resistor that can be used to embody the resistor load in the reference load of FIG. 2.

In an embodiment, the resistor 211 is a tunable resistor of an adjustable resistance. An embodiment of a tunable resistor 400, in accordance with an embodiment of the present disclosure, is shown in FIG. 4. Tunable resistor 400 comprises a parallel connection of a plurality of switch-resistor cells 410, 420, 430, and so on, controlled by comprising a plurality of logical signals $C_1$, $C_2$, $C_3$, and so on, respectively. Said plurality of logical signals collectively from a control signal. Switch-resistor cell 410 (420, 430) comprises a serial connection of a resistor 411 (421, 431) and a switch 412 (422, 432) controlled by $C_1$ ($C_2$, $C_3$). When $C_1$ ($C_2$, $C_3$) is high, switch 412 (422, 432) is turned on and a resistance of switch-resistor cell 410 (420, 430) is approximately equal to a resistance of resistor 411 (421, 431). When $C_1$ ($C_2$, $C_3$) is low, switch 412 (422, 432) is turned off and switch-resistor cell 410 (420, 430) is approximately an open circuit.

A resistance of the tunable resistor 400 can be adjusted by changing a value of a logical signal among $C_1$, $C_2$, $C_3$, and so on. This would be obvious to those of ordinary skill in the art and thus not further described herein. In an embodiment, resistors 411, 421, 431, and so on, are identical; in this case, when more (less) logical signals among $C_1$, $C_2$, $C_3$, and so on are set high, the tunable resistor 400 has a smaller (larger) resistance, and an increment (decrement) of the control signal, which occurs when one of $C_1$, $C_2$, $C_3$, and so on is flipped from low (high) to high (low), leads to a decrement (increment) of the resistance of the tunable resistor 400.

Figure 5:
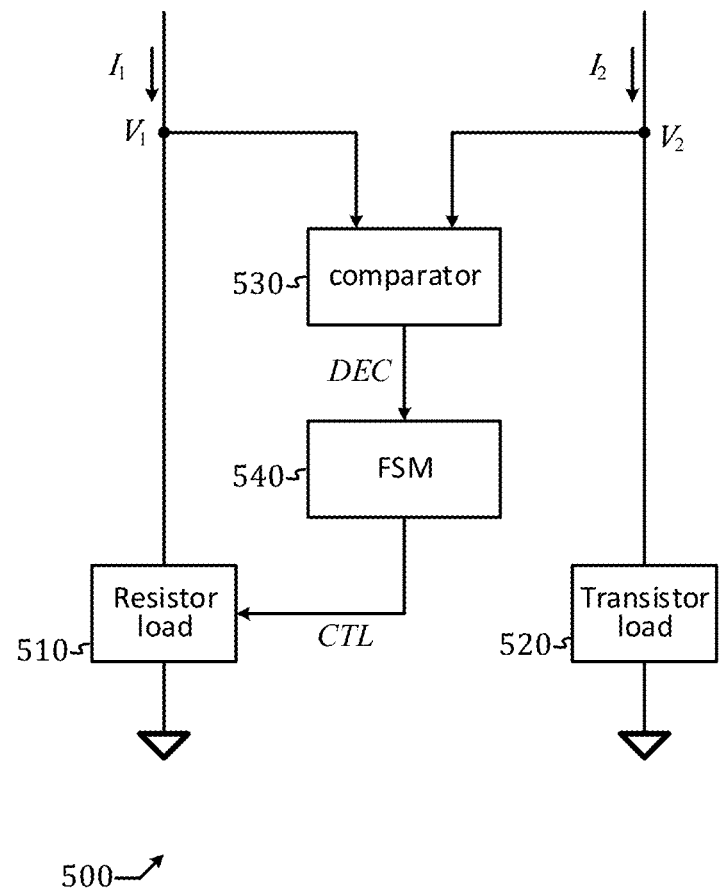
FIG. 5 shows a functional block diagram of a calibration circuit in accordance with an embodiment of the present disclosure.

In an embodiment, a resistance of the resistor load 210 is adjusted in accordance with a comparison with a resistance of the transistor load 220. A functional block diagram of a calibration circuit 500 in accordance with an embodiment of the present disclosure is shown in FIG. 5. Calibration circuit 500 comprises a resistor load 510, a transistor load 520, a comparator 530, and a finite state machine (FSM) 540. The resistor load 510 can be either a replica of the resistor load 210 or the resistor load 210 itself if an in-situ calibration is taken. Likewise, the transistor load 520 can be either a replica of the transistor load 220 or the transistor load 220 itself if an in-situ calibration is taken. Instead of being configured in a parallel connection topology, the resistor load 510 and the transistor load 520 separately receive a first current $I_1$ and a second current $I_2$, and establish a first voltage $V_1$ and a second voltage $V_2$, respectively. The comparator 530 compares the first voltage $V_1$ with the second voltage $V_2$ and output a logical signal DEC indicating whether the first voltage $V_1$ is higher than the second voltage $V_2$. The FSM 540 receives the logical signal DEC and outputs a control signal CTL to adjust the resistor load 510. An increment (decrement) of a value of the control signal CTL leads to a decrement (increment) of a resistance of the resistor load 510.

For instance, when the tunable resistor 400 of FIG. 4 is used to embody the resistor load 510, the control signal CTL is a collection of the logical signal $C_1$, $C_2$, $C_3$, and so on, and an increment (decrement) of a value of the control signal CTL is fulfilled by flipping one of $C_1$, $C_2$, $C_3$, and so on from low (high) to high (low). If the logical signal DEC indicates the first voltage $V_1$ is higher (lower) than the second voltage $V_2$, the FSM 540 will increment (decrement) a value of the control signal CTL to lower a resistance of the resistor load 510. The resistance of the resistor load 510, therefore, is adjusted towards being equal to a resistance of the transistor load 520 scaled by a factor determined by $I_2/I_1$, a ratio between the second current $I_2$ and the first current 4. For instance, if 4 is three times larger than $I_2$, the resistance of the resistor load 510 will be adjusted towards being approximately one third of the resistance of the transistor load 520; this can be proved by applying the Ohm's law that is well understood by those of ordinary skills in the art.

In an embodiment, the calibration circuit 500 further comprises a temperature sensor (not shown in FIG. 5) that measures a temperature, and the first current 4 and the second current $I_2$ are scaled based on the temperature in accordance with a look-up table (not shown in FIG. 5); at a higher (lower) temperature, a value of $I_2/I_1$ is larger (smaller) in the look-up table, as the resistance of the resistor load 510 is higher (lower). This way, the resistance of the resistor load 510 is adjusted towards being equal to the resistance of the transistor load X520 times a scaling factor set in accordance with the temperature. A current such ash or $I_2$ can be scaled using a "current mirror" scheme that is well known in the prior art and thus not described in detail here. Comparators, temperature sensors, finite state machines, and look-up tables are also well understood by those of ordinary skills in the art and thus not described in detail herein.

If the resistor load 510 is a replica of the resistor load 210, the control signal CTL of the calibration circuit 500 is used to control the resistor load 210.

In an embodiment, the reference current $I_{REF}$ is a "constant-gm" current, which is well known in the prior art and thus not described in detail. In another embodiment, the reference current $I_{REF}$ is a "PTAT (proportional to absolute temperature)" current, which is also well known in the prior art and thus not described in detail here. Both a "constant-gm" current and a "PTAT" current can be scaled by the "current mirror" scheme that is well known in the prior art and thus not described in detail here.

In an alternative embodiment, the transistor load 220 is replaced with the reference load 110, i.e. a NMOS transistor and a PMOS transistor that are stacked and configured in a diode-connect topology.

Those skilled in the art will readily observe that numerous modifications and alterations of the device and method may be made consistent with the scope and spirit of the invention. Accordingly, the above disclosure should not be construed as limited only by the metes and bounds of the appended claims.

What is claimed is:

1. A calibration circuit comprising:
   a resistor load comprising a tunable resistor controlled by a control signal and configured to receive a first current and establish a first voltage accordingly;
   a transistor load comprising a plurality of transistors and configured to receive a second current and establish a second voltage accordingly;
   a comparator configured to output a logical signal in accordance with a comparison of the first voltage with the second voltage; and
   a finite state machine configured to receive the logical signal and output the control signal.

2. The calibration circuit of claim 1 further comprises a temperature sensor configured to sense a temperature.

3. The calibration circuit of claim 2, wherein a ratio between the first current and the second current is set in accordance with the temperature.

4. The calibration circuit according to claim 1, wherein a temperature coefficient of the resistor load is positive, and a temperature coefficient of the transistor load is negative.

* * * * *